United States Patent [19]
Delgado et al.

[11] Patent Number: 5,091,331
[45] Date of Patent: Feb. 25, 1992

[54] ULTRA-THIN CIRCUIT FABRICATION BY CONTROLLED WAFER DEBONDING

[75] Inventors: Jose A. Delgado, Palm Bay; Stephen J. Gaul, Melbourne; George V. Rouse, Indialantic; Craig J. McLachlan, Melbourne Beach, all of Fla.

[73] Assignee: Harris Corporation, Melbourne, Fla.

[21] Appl. No.: 509,405

[22] Filed: Apr. 16, 1990

[51] Int. Cl.$^5$ .................... H01L 21/304; H01L 21/76
[52] U.S. Cl. ........................................ 437/62; 437/86; 437/974; 437/226; 148/DIG. 28; 156/630
[58] Field of Search .................... 437/226, 227, 62, 86, 437/974; 148/DIG. 28, DIG. 12; 156/630

[56] References Cited

U.S. PATENT DOCUMENTS

| | | | |
|---|---|---|---|
| 4,121,334 | 10/1978 | Wallis | 437/226 |
| 4,784,970 | 11/1988 | Solomon | 437/51 |
| 4,975,390 | 12/1990 | Fujii et al. | 148/DIG. 12 |

FOREIGN PATENT DOCUMENTS

| | | | |
|---|---|---|---|
| 57-15439 | 1/1982 | Japan | 437/226 |
| 60-220947 | 11/1985 | Japan | 437/968 |

OTHER PUBLICATIONS

Bushman, T. D., "Dicing Techniques—A Survey" *SCP & Solid State Technology*, 11/64, pp. 38–42.

*Primary Examiner*—Olik Chaudhuri
*Assistant Examiner*—G. Fourson
*Attorney, Agent, or Firm*—Barnes & Thornburg

[57] ABSTRACT

A process including forming peaks and valleys in a bonding surface of a first wafer so that the peaks are at the scribe lines which define dice. The peaks and not the valleys of the first wafer is bonded to a bonding surface of a second wafer. The device forming steps are performed on one of the wafers. Finally, the wafer in which the devices are formed is cut through at the peaks to form the dice. The peaks may be substantially the size of the kerf produced by the cutting such that the dice are separated from the other wafer by the cutting step. Alternately, the peaks may have a width greater than the kerf produced by the cutting and remain attached to the other wafer by the remaining peak portions. The dice are then separated from the other wafer at the remaining peak portions by an additional step.

16 Claims, 3 Drawing Sheets

ULTRA-THIN CIRCUIT FABRICATION BY CONTROLLED WAFER DEBONDING

BACKGROUND AND SUMMARY OF THE INVENTION

The present invention relates generally to methods of fabricating thin wafers and more specifically to a method for dicing thin wafers.

It is known in the prior art to bond a pair of wafers together and perform wafer thinning as well as device formation steps on one of the wafers (usually referred to as the device wafer). The other wafer remains generally intact throughout the process and is usually referred to as the handle wafer, as it provides support during the device formation steps. After device formation, the wafer is broken into dice by generally using a dicing saw. For certain applications, such as focal plane array electronics, it is desirable to fabricate circuits on thin substrates in order to achieve maximum packing density in a module which usually operates in low temperature environments. These types of detection systems are targeted for spaceborne applications which impose stringent space and weight limitations.

An example of this type of application and details of its fabrication is given in U.S. Pat. No. 4,784,970 by Solomon. While Solomon teaches methods for forming multiwafer integrated circuits with abutting electrical connection to external electronics, he does not furnish details for fabricating integrated circuits on thin substrates except for indicating that an integrated circuit wafer could be thinned as part of the processing prior to wafer dicing.

In terms of a bonded pair of wafers, it is possible to remove the handle wafer after thinning the device wafer, either before, during or after the device formation steps. However, removal of the handle wafer will result in a substantially thinner wafer and an increase in wafer breakage during subsequent processing steps. Removing the handle from the individual dice after dicing is substantially an impossible task.

Thus it is an object of the present invention to provide a method of bonding two wafers for processing which allows easy separation of the two wafers after the processing.

Another object of the present invention is to provide a method of bonding two wafers which debond substantially by the dicing process without any special treatment after device forming steps.

These and other objects are achieved by a process including forming peaks and valleys in a bonding surface of a first wafer so that the peaks are at the scribe lines which define the individual dice. The peaks and not the valleys of the first wafer are oxide bonded to a bonding surface of a second wafer. The device performing steps are performed on one of the wafers. Finally, the wafer in which the devices are formed is cut through at the peaks to form the dice. The peaks may be selected to be substantially the size of the kerf produced by the cutting such that the dice are separated from the other wafer by the cutting step. Alternately, the peaks may have a width greater than the kerf produced by the cutting and remain attached to the other wafer by the remaining peak portions. The dice are then separated from the other wafer at the remaining peak portions. The separation may be produced by applying ultrasound to the wafers, etching the remaining peaks, or mechanically breaking the bond at the remaining peaks.

The peaks and valleys may be formed by selectively introducing impurities into the bonding surface of the face first wafer to produce areas of enhanced oxidation. This is followed by oxidizing the bonding surface of the first wafer to produce oxide peaks at the area of enhanced oxidation. Alternatively, the oxide peaks maybe produced by masking the bonding surface of the first wafer with oxide inhibiting material having openings to expose the area of the bonding surface in which the peaks are to be formed and oxidizing the exposed surface to form the peaks. In a further alternative to forming the oxide peaks, the bonding surface of the first wafer is masked with an oxide material having openings to expose the valley portion of the first surface. This is followed by oxidizing the bonding surface thereby forming valleys in the exposed areas between the mask peaks. As an even further alternative, the bonding surface of the first wafer can be selectively etched to form valleys between unetched peaks.

The peaks are formed to have a height sufficient to prevent the valleys from bonding to the second wafer. The valleys may have material applied therein which will not bond with the second wafer. These material preferably have a thickness less than the height of the peaks. These materials may include conductors which are patterned or for example a diamond film which acts as a heat sink.

Other objects, advantages and novel features of the present invention will become apparent from the following detailed description of the invention when considered in conjunction with the accompanying drawings.

DETAILED DESCRIPTION OF THE DRAWINGS

Figure 1A:
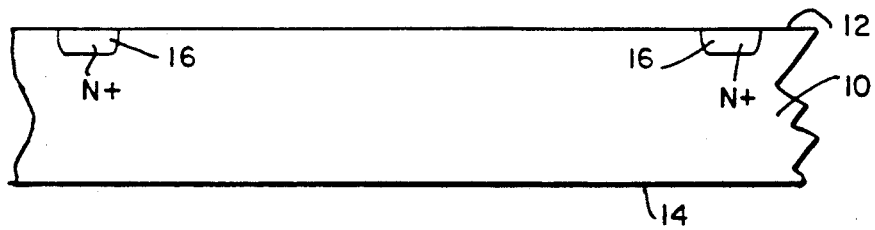
FIGS. 1A through 1E illustrate various stages of the process of fabrication according to the principles of the present invention.
Figure 1B:
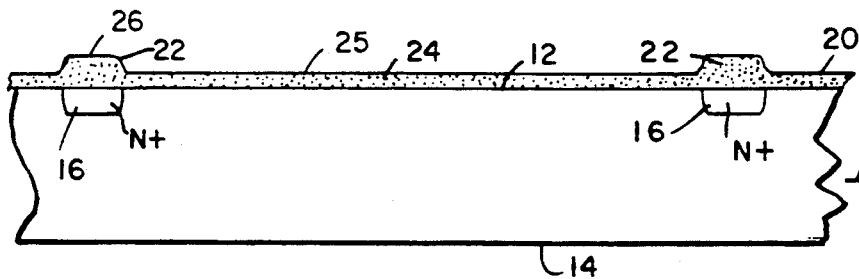

Wafer 10, having surfaces 12 and 14, has a general thickness in the range of 18 to 25 mils. The surface 12, the considered bonding surface, is treated to be responsive to enhanced oxidation. For example, N type impurities, such as arsenic or phosphorus, are applied selectively to form the N+ region 16 in the surface 12 as illustrated in FIG. 1A. The wafer is then subjected to oxidation to produce the oxide layer 20 as illustrated in FIG. 1B. Because of the enhanced oxidation of the N+ regions 16 compared to the remainder of the surface 12 of the wafer 10, peaks 22 are formed with valley region 24 therebetween. For example, a selective implant of phosphorus at an energy of 80 KeV and dose of $1 \times 10^{16}$ ions/cm² forms the N+ regions 16. After undergoing an oxidation in a steam ambient at 1000° C. for 23 minutes, an oxide thickness of about 200 nm is produced in the valley portion 24 while an oxide thickness of about 350 nm is grown in the peak portion 22. Due to the differential consumption of the silicon substrate between the valley and peak portions during this oxidation, an actual step height of 92 nm is produced between the oxide surface 26 in the peak region and the oxide surface 25 in the valley region.

Figure 1C:
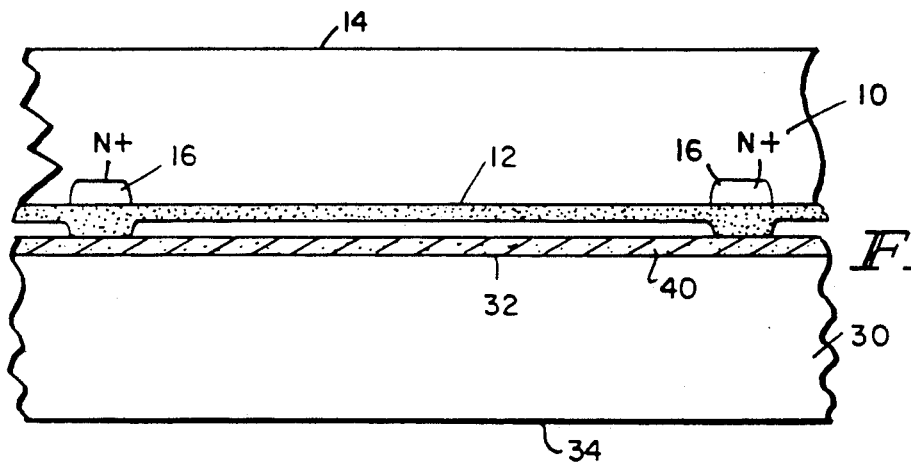

A handle wafer 30, including an oxide bonding layer 40 on bonding surface 32, is then bonded to the wafer 10 forming a bond between peaks 22 and the oxide bonding layer 40. This bonding may be achieved by pressing the two wafers 10 and 30 together and subjecting them to heat in the range of 900° C. to 1200° C. As shown in FIG. 1C, the peaks 22 are sufficiently high compared to thickness of the valley 24 such that wafer 10 is only bonded to wafer 30 at the peaks 22.

Figure 1D:
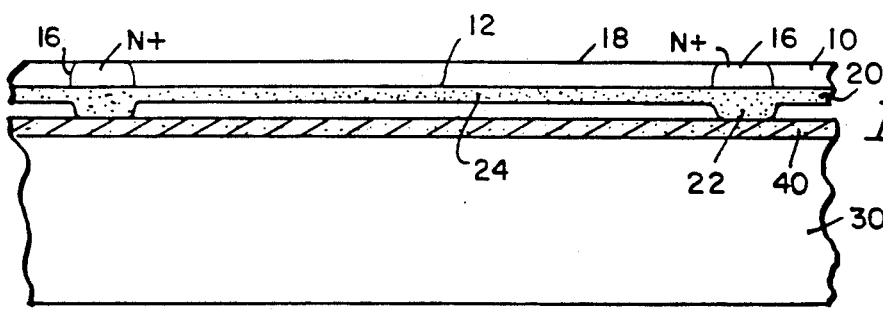

Depending upon the thickness of the device wafer 10 and the desired thickness, wafer 10 maybe diminished in thickness as illustrated in FIG. 1D. Surface 14 is ground down to create a new surface 18 which exposes the N+ region 16. Oxidation of the surface 18 will produce enhanced oxidation in the N+ region 16, which can be used for alignment of subsequent masks in forming devices in the surface 18. Surface 18 is then subjected to device forming steps to form device regions 19 illustrated in FIG. 1E. It should be noted that the thickness of wafer 10 may not be diminished all the way to expose the N+ region 16 or may not be diminished at all. In this case, a subsequent mask must be aligned to the bonded regions at the peaks 22 using IR alignment and device forming steps are performed in the surface 14 or the surface 18. Following the device formation steps, the surface 18 which will include conductors and interconnect, is covered with an insulation layer 17.

Figure 1E:
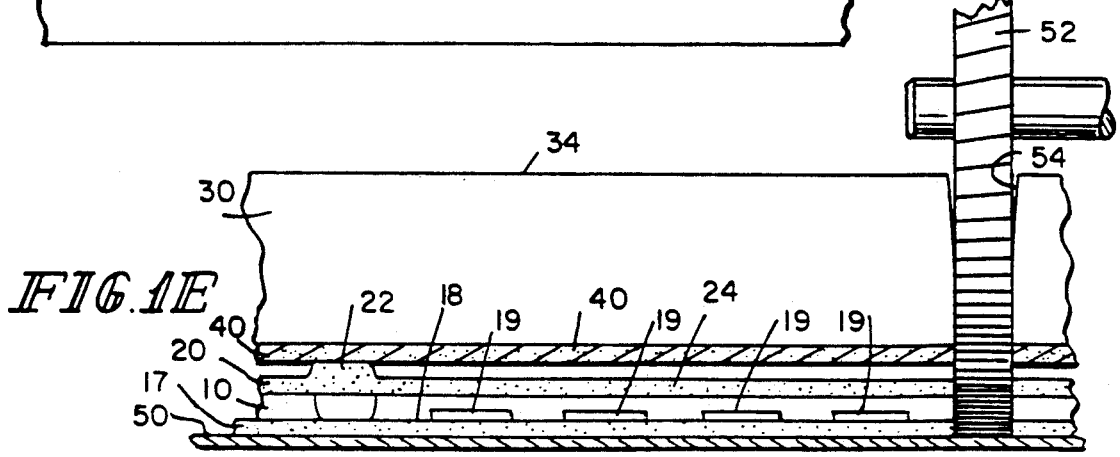

The device surface 18 and layer 17 maybe mounted to a sticky tape frame 50 as shown in FIG. 1E. The wafers are then cut into dice by, for example, a dicing saw 52. The resulting kerf 54 of the saw is equal to or greater than the width of the peaks 22. Thus the dicing operation will totally separate the dice of wafer 10 from the handle wafer 30. In this particular example, the dice are maintained on the sticky tape frame 50. Although the dicing has been shown to take place at the rear surface 34 of the handle wafer 30, the dicing operation may also take place from the device surface 18 of the device wafer 10. In such a case, the handle wafer 30 need not be cut all the way through as long as the kerf 54 extends through the device wafer 10 and the peaks 22 so as to separate the dice from the handle wafer 30.

Although, the forming of the peaks and valleys is shown in FIGS. 1A through 1E to be on the bonding surface of the device wafer, the same principle would apply if the peaks and valleys are formed on surface 32 of the handle wafer. This applies not only to this example but also to the later to be described examples.

Figure 2:
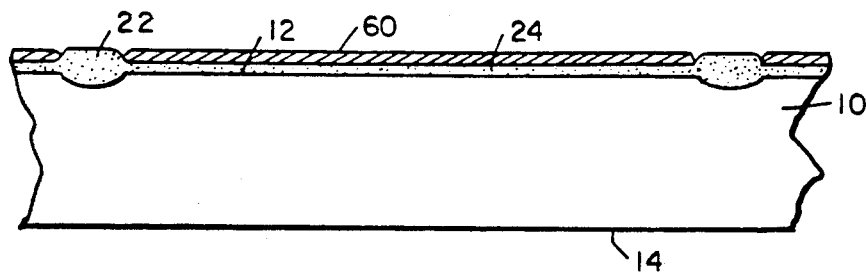
FIG. 2 illustrates a process of forming the oxide peaks and valleys using localized oxidation.

Another way to form the oxide hills and valleys is by localized oxidation. As illustrated in FIG. 2, an oxide inhibiting mask 60, for example silicon nitride, is formed to have openings exposing the surface 12 of wafer 10 at the peak locations. The wafer is then subjected to an oxidation environment and the peaks 22 are formed in the openings of the oxide inhibiting mask 60. Prior to applying the mask 60, a thin layer of oxide 24 is applied to protect the surface 12 of the wafer 10 from the oxide inhibiting mask. Preferably the mask 60 is removed prior to bonding with the wafers. If the oxide inhibiting mask will not bond with the handle wafer or will not create excessive stress, it may be left in place.

An alternative to this method would grow the local oxide in the valley regions, thereby consuming semiconductor material while masking the peak regions with the oxidation inhibiting material. After removal of the oxidation inhibiting material, the local oxide is removed, leaving recessed areas corresponding to the valley regions.

Another method of forming the peaks and valleys is using selective etching as illustrated in 3A through 3C. The bonding surface 12 of the device wafer 10 is covered with a mask 62 wherein the mask material covers the areas which will form the peaks. The surface 12 is then subjected to an etchant to form the valley portions 13 between the peaks 12, as illustrated in FIGS. 3B. The bonding surface 12 and 13 is then subjected to oxidation to produce a bonding layer 20 having valleys 24 between the peaks 22.

Figure 4A:
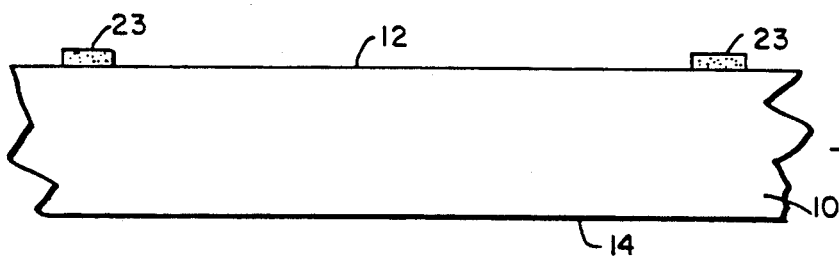
FIGS. 4A and 4B show a process of forming the oxide peaks and valleys by preforming oxide regions on the peaks.
Figure 4B:
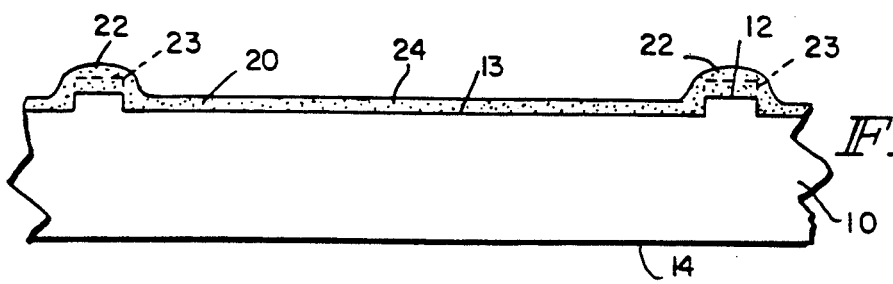

Another method of forming peaks and valleys is to provide areas of decreased oxidation. As illustrated in FIG. 4A, a layer of oxide material 23 forms a mask over the surface 12 with exposed portion at the valleys. The oxide mask 23 maybe formed by chemical vapor deposition of an oxide. The masked wafer 10 and surface 12 is subjected to an oxidation environment. The exposed area 12 oxidized at a greater rate than the unexposed areas under the oxide mask 23. This oxidation will consume a portion of the exposed surface 12 to result in valley region 13 between the peaks 12 as illustrated in FIG. 4B. The resulting oxide layer 20 also includes peaks 22 with valley portion 24. The original oxide layer 23 forms part of the peaks 22 since thermal-oxidation will not by itself produce sufficient material to form the desired peak.

Figure 3A:
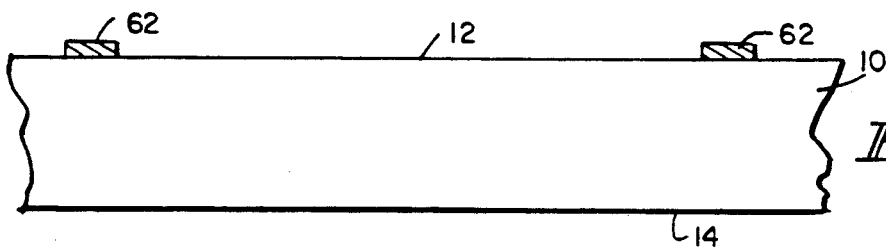
FIGS. 3A through 3C show process of forming the peaks and valleys using etching.
Figure 3B:
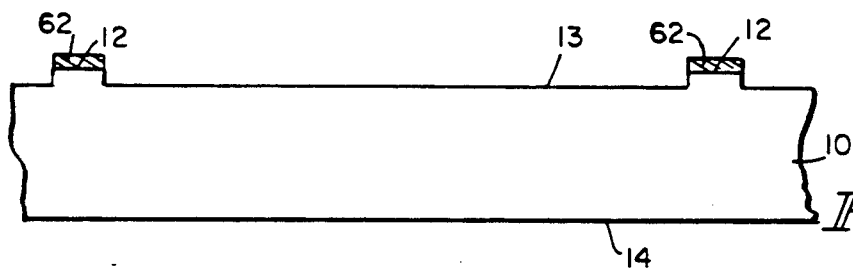
Figure 3C:
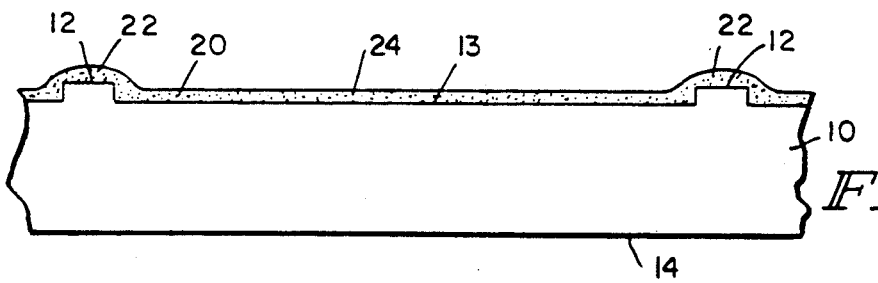

In the embodiments illustrated in FIGS. 3 and 4 which produced peaks 12 and valleys 13 in the bonding surface of the wafer 10, the oxide layer 20 may be omitted since the handle wafer includes an oxide bonding layer 40 which is capable of bonding to the bonding surface 12.

Figure 5A:
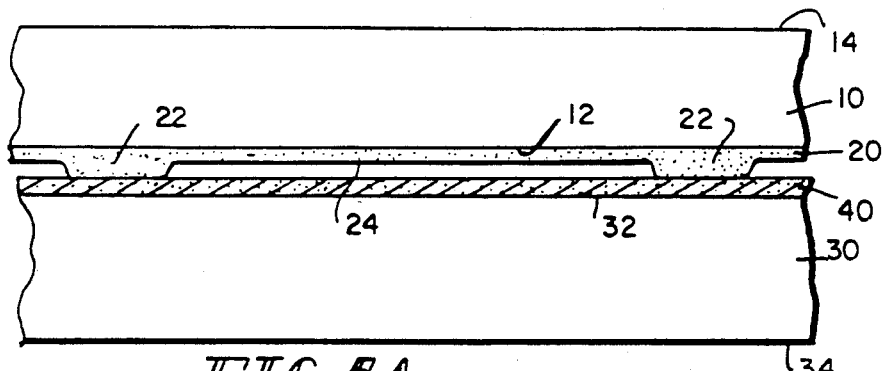
FIGS. 5A and 5B illustrate a process wherein the peaks have a width greater than the cutting kerf.
Figure 5B:
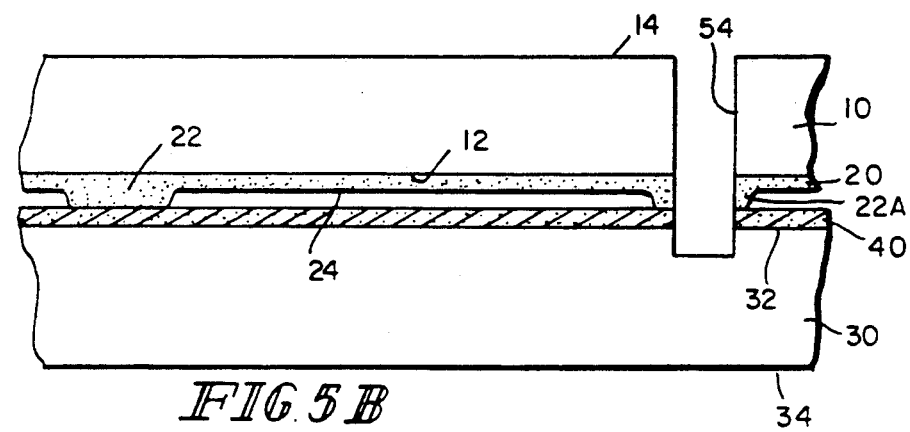

Using any of the previous processes, the width of the peak 22 maybe greater than the kerf 54 produced by the dicing operation. As illustrated in FIG. 5A and 5B, the dicing operation kerf 54 removes a substantial portion of the peak 22 leaving portions 22a. Thus after the dicing operation, the dice remain fixed to the handle wafer 30 by very small portion 22A of the original bonding peak. This provides the required support to keep the dice from moving and being damaged during the dicing operation. In addition, it provides a rigid support to facilitate further handling.

After the wafer has been completely diced, the remaining portions 22a maybe removed by applying ultrasound to the wafer structure. This could be achieved by immersing the bonded wafers 10 and 30 in an ultra-sonic bath. As alternative, the remaining peaks 22a maybe etched. This would require providing a protective layer on the surface on surface 14 on the dice prior to dicing and then using, for example, a hydrofluoric dip to release or lift off the dice after dicing. Depending upon the amount of bonded peak 22a left, mechanical means maybe used to break the remaining bond. This could include prying off the dice.

Although FIGS. 5A and 5B show increased width peak 22 at the scribe lines, the same effect could be achieved by providing additional peaks 22 at positions other than the scribe lines for the dice. Thus the peaks 22 could have width no greater than the kerf 54 and additional peaks would have a relatively small width so that they can be removed by any of the methods discussed with respect to FIGS. 5A and 5B.

Figure 6:
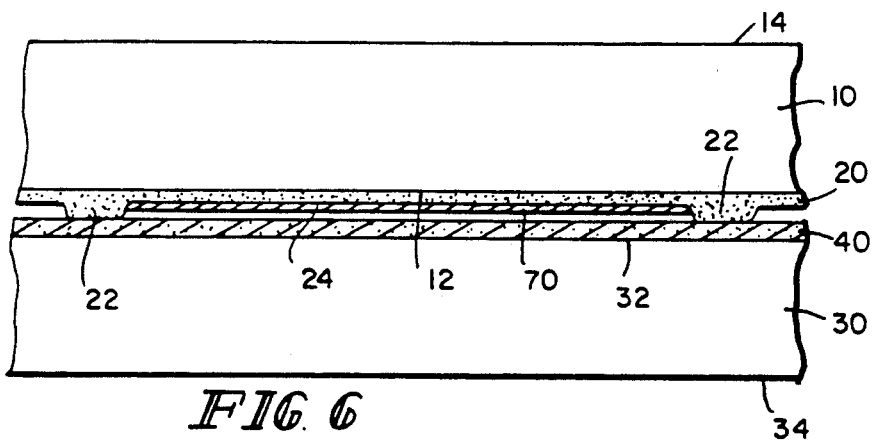
FIG. 6 illustrates a first type of material in the valleys of the present invention.
Figure 7:
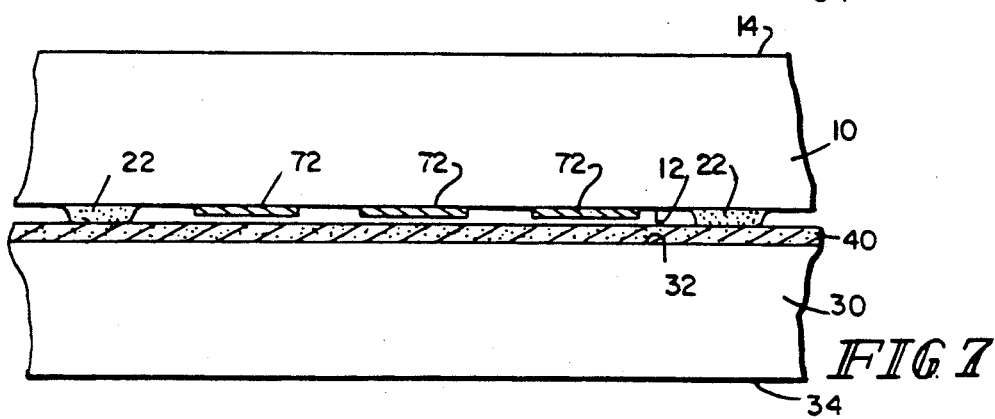
FIG. 7 illustrates another embodiment with conductors in the valleys of the present invention.

As discussed with respect to FIG. 2, the valley between the peak 22 may include material which would not bond the two wafers together. One example illustrated in FIG. 6, would be to provide a diamond film layer 70 which would act as a heat sink. This diamond layer would extend between the peaks 22 and have a thickness less than the height of the peaks. As a further example illustrated in FIG. 7, the void may include patterned conductive layers 72. This could include metal or silicide and act as interconnect, buried layer, buried Schottky diodes as well as backside bond pads.

Although, the kerf 54 is described as being formed by a dicing saw 52, it should be noted that the kerf 54 may also be formed by any of the well known trench etching techniques.

Another method for dice separation involves the use of a wax coated substrate, such as sapphire. The wafer to be diced is rigidly mounted on this substrate material with the device wafer facing the substrate. Separation of the dice is achieved in a manner similar to that shown in FIG. 1E, where the dicing operation takes place from the backside of the wafer. However, in this case, the sticky tape is replaced by the substrate material. A heating operation or a solvent dip may be used to removed the dice from the substrate.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A method of fabricating integrated circuits in wafers comprising:
    forming peaks and valleys in a bonding surface of a first wafer, with the peaks being at the scribe lines which define dice;
    oxygen bonding said peaks and not said valleys of said first wafer to a bonding surface of a second wafer;
    performing device formation steps on a surface of one of said first and second wafers;
    cutting through said one of said first and second wafers and said peaks to form dice; and
    separating said dice from said other of said wafers.

2. A method according to claim 1 wherein said peaks are formed to have a width substantially equal to the kerf produced in the cutting step whereby the dice of said one of said wafers are separated from the other of said first and second wafers by said cutting step.

3. A method according to claim 1 wherein said peaks are formed to have a width greater than the kerf produced in the cutting step, whereby the dice of said one of said wafers remain attached to the other of said first and second wafers by remaining peaks after said cutting step; and
    separating said dice from said other of said wafers at said remaining peaks.

4. A method according to claim 3 wherein said separating step includes applying ultra-sound to said wafers.

5. A method according to claim 3, wherein said separating step includes etching said remaining peaks.

6. A method according to claim 3, wherein said separating step includes mechanically breaking the bond at said remaining peaks.

7. A method according to claim 1 wherein said forming peaks and valleys step includes selectively etching said bonding surface of said first wafer to form valleys between unetched peaks.

8. A method according to claim 1 wherein said peaks are formed to have a height sufficient to prevent said valleys from bonding to said second wafer.

9. A method according to claim 1 wherein said device formation steps are performed on said first wafer.

10. A method of fabricating integrated circuits in wafers comprising:
    forming peaks and valleys in a bonding surface of a first wafer, with the peaks being at the scribe lines which define dice;
    forming a layer in said valleys of material which will not bond with a second wafer;
    oxygen bonding said peaks and not said valleys of said first wafer to a bonding surface of a second wafer;
    performing device formation steps on a surface of one of said first and second wafers; and
    cutting through said one of said first and second wafers and said peaks to form dice.

11. A method according to claim 10 wherein said layer of material is formed in said valley to have a thickness less than the height of said peaks.

12. A method according to claim 10 wherein said material in said valley is conductive; and including patterning said material.

13. A method according to claim 10 wherein said material is a diamond film.

14. A method of fabricating integrated circuits in wafers comprising:
    forming peaks and valleys in a bonding surface of a first wafer, with the peaks being at the scribe lines which define dice, selectively introducing impurities into said bonding surface of said first wafer to form areas of enhanced oxidation susceptibility and oxidizing said bonding surface of said first wafer to form oxide peaks at said areas of enhanced oxidation susceptibility;
    oxygen bonding said peaks and not said valleys of said first wafer to a bonding surface of a second wafer;
    performing device formation steps on a surface of one of said first and second wafers; and
    cutting through said one of said first and second wafers and said peaks to form dice.

15. A method of fabricating integrated circuits in wafers comprising:
    forming peaks and valleys in a bonding surface of a first wafer, with the peaks being at the scribe lines which define dice, by masking said bonding surface of said first wafer with an oxide inhibiting material having openings to expose areas of said bonding surface and oxidizing said exposed areas of said bonding surface to form peaks on said exposed areas;
    oxygen bonding said peaks and not said valleys of said first wafer to a bonding surface of a second wafer;
    performing device formation steps on a surface of one of said first and second wafers; and
    cutting through said one of said first and second wafers and said peaks to form dice.

16. A method of fabricating integrated circuits in wafers comprising:

forming peaks and valleys in a bonding surface of a first wafer, with the peaks being at the scribe lines which define dice, by depositing a bonding material on said bonding surface of said first wafer and subsequent patterning of said deposited bonding material to form the peaks and valleys;

oxygen bonding said peaks and not said valleys of said first wafer to a bonding surface of a second wafer;

performing device formation steps on a surface of one of said first and second wafers; and cutting through said one of said first and second wafers and said peaks to form dice.

* * * * *